United States Patent [19]

Kim et al.

[11] Patent Number: 6,087,215
[45] Date of Patent: *Jul. 11, 2000

[54] METHOD OF FABRICATING A DRAM DEVICE

[75] Inventors: Tae Woo Kim, Seoul; Jae Goan Jeong, Ich'on, both of Rep. of Korea

[73] Assignee: Hyundai Electronics Industries Co., Ltd., Ich'on, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/996,018

[22] Filed: Dec. 22, 1997

[30] Foreign Application Priority Data

Dec. 27, 1996 [KR] Rep. of Korea .................. 96-72816

[51] Int. Cl.⁷ ................. H01L 21/8242; H01L 21/425
[52] U.S. Cl. ................. 438/253; 438/390; 438/395; 438/529; 257/303
[58] Field of Search ................. 257/349, 647, 257/303; 438/396, 210, 228, 232, 577, 546, 551, 390, 253, 395, 524, 529, 257

[56] References Cited

U.S. PATENT DOCUMENTS

| | | | |
|---|---|---|---|
| 5,030,586 | 7/1991 | Matsuda et al. | 438/527 |
| 5,134,085 | 7/1992 | Gilgen et al. | 438/210 |
| 5,389,558 | 2/1995 | Suwanai et al. | 438/421 |
| 5,558,313 | 9/1996 | Hshieh et al. | 257/342 |
| 5,932,906 | 8/1999 | Shimizu | 257/306 |

FOREIGN PATENT DOCUMENTS 63-318150 12/1988 Japan .

OTHER PUBLICATIONS

English translation of Purpose and Constitution of JP63–318150 (Dec. 27, 1988).

*Primary Examiner*—Wael Fahmy
*Assistant Examiner*—William David Coleman

[57] ABSTRACT

To reduce a junction leakage of an junction interface between a P type well portion formed on a P type substrate and a source region, an impurity region of a first conductive type or a second conductivity type is formed at the junction interface. A plug ion is implanted in the source region to increase a depletion depth of the source region and a counter doping is then performed in the source region to reduce an electrical field of the source region.

16 Claims, 7 Drawing Sheets

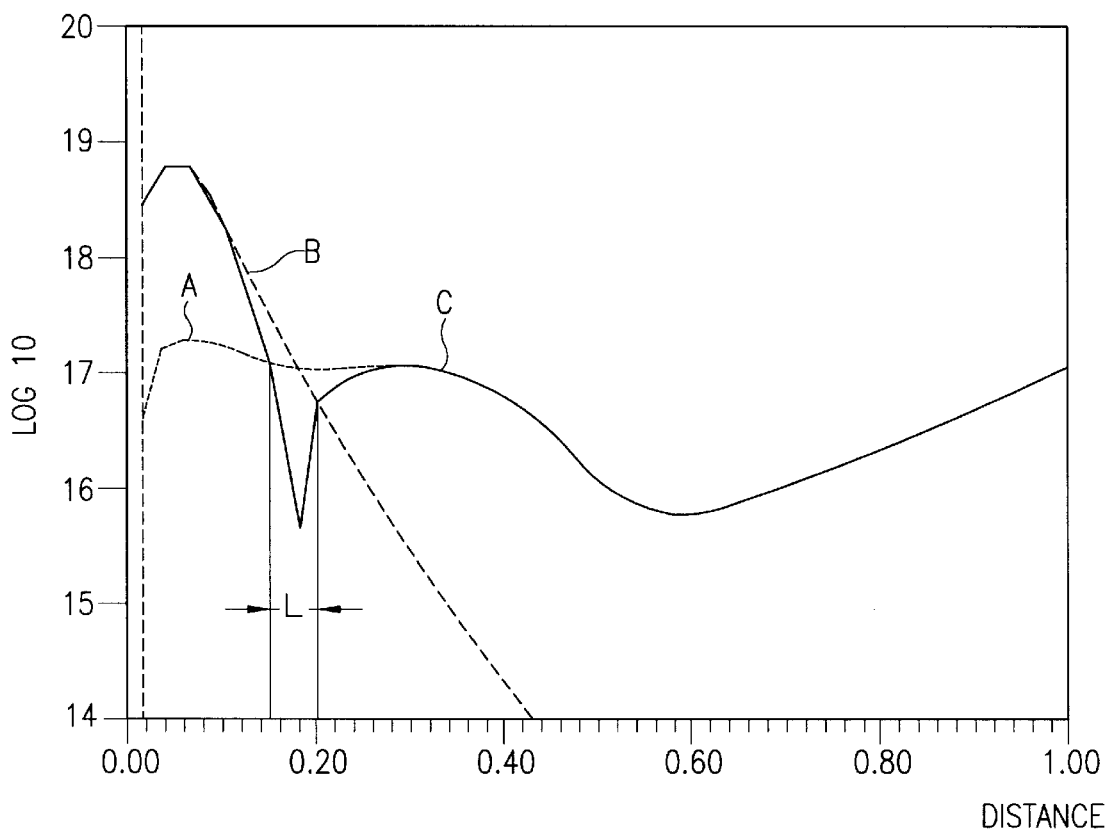

METHOD OF FABRICATING A DRAM DEVICE

BACKGROUND OF INVENTION

1. Field of the Invention

The invention relates to a method of fabricating a DRAM device, and more particularly to a method of fabricating a DRAM device which has an improved refresh characteristic through a decrease of a junction leakage.

2. Related Prior Art

In a dynamic random access memory (DRAM) including a capacitor and a transistor, the transistor, in general, serves as a switching device which stores or discharges a charge. Since the capacitor of the DRAM discharges the charges therein naturally with the lapse of the time, the capacitor must be recharged per a selected period. Such a recharge is referred as "refresh". So as to refresh the DRAM, it is required to connect a refresh circuit to the DRAM.

FIG. 1a is a cross-sectional view of the DRAM. On a portion of a semiconductor substrate 1 having a P type well 1A is formed a field oxide layer 2 by a known LOCOS technique. On a portion of the surface of the semiconductor substrate 1 between two adjacent field oxide layers is formed a gate oxide 3A. Following the formation of the gate oxide 3A, a gate electrode material, for example a polysilicon with a doped impurity is deposited with a selected thickness on the resultant structure of the semiconductor device and is then patterned to form a gate electrode 3. To both sides of the gate electrode 3 on the semiconductor substrate are implanted impurity ion, for example, phosphorus ion, with a dose of $2 \times 10^{13}$ ions /cm$^2$, forming a source region 4A and a drain region 4B. Here the impurity is a counter type to that of the substrate. So as to isolate the gate electrode 3 from a capacitor to be formed in the future step an interlayered insulating layer 5 is formed on the entire surface of the resultant structure having a transistor. A contact hole 6 for connecting the transistor with a storage node electrode of the capacitor is formed by etching a portion of the interlayered insulating layer 6. So as to obtain a sufficient width of the contact hole during the formation of the contact hole, a portion of bird's beak formed at both sides of the field oxide layer is etched. Furthermore, so as to compensate the defects of the semiconductor substrate occurred during the formation of the contact hole, a selected plug ion, for example phosphorus ion is ion-implanted.

Next, a polysilicon layer doped with a phosphorus ion is formed on the resultant and is then patterned to form a storage node electrode(not shown). Afterwards, in a known manner the steps of forming a dielectric film on the top surface of the storage node electrode and of forming a plate node electrode on the top surface of the dielectric film are carried out.

FIG. 1b is a graph showing a concentration distribution of an impurity according to a depth of a source region of the DRAM device shown in FIG. 1a. Wherein a horizontal axis represents the depth of the source region and a vertical axis represents a concentration of an impurity. A curve A shows a doping profile of P type well when a first conductive type impurity is used. A curve B shows a doping profile of a junction region of the substrate when a second conductive impurity is used. A curve C shows a concentration difference between the curve A and the curve B. The curve A shows that a concentration distribution of an impurity is almost even until a selected depth of the semiconductor device. The curve B shows that the concentration of impurity has a peak value near the top surface of the semiconductor substrate and decreases from the peak value according to the increase of the depth of the substrate. The curve C shows that it decreases rapidly at the intersecting portion of the curve A and the curve B, i.e., near a junction interface and after that has almost equal to that of P well.

However, since an impurity concentration contained in the storage node electrode is higher than that of a junction region, the impurity of the storage node out-diffuses into the junction region. At this time, the impurities within the storage node electrode diffuse mainly into a plug ion implantation region and a strong electrical field is thereby formed at the source region since the source region becomes asymmetrical. The strong electrical field generates a large amount of leakage current due to an impact ionization. The leakage current lowers the refresh characteristic, a yield and reliability of the DRAM cell.

SUMMARY OF THE INVENTION

Accordingly, the object of this invention is to provide a method of fabricating a DRAM device having an improved refresh characteristic thereof by minimizing a leakage current of a DRAM cell.

So as to accomplish the above object, a method of fabricating a DRAM device includes a step of forming an impurity region at a junction interface between a source region and a well region, i.e., at a region underlying the source region, to thereby increase the width of a depletion region at the source region.

A method of fabricating a DRAM device according to a first embodiment of this invention includes steps of forming a well region of a first conductivity type in a semiconductor substrate, and then forming an impurity region at a selected portion of the well region. Next, a gate electrode is formed at a selected portion of a top surface of the semiconductor substrate and source and drain regions of a second conductivity type are then formed at both sides of the gate electrode within the well region. Here, the source region is formed between the impurity region and the surface of the substrate. Successively, an interlayered insulating layer is formed all over the surface of the semiconductor substrate having the gate electrode, and source and drain regions. A selected portion of the interlayered insulating layer is etched to form a contact hole for a storage node. Afterwards, an impurity ion of a second conductivity type is plug ion-implanted at the source region with a high dose. Following the plug ion-implanted, a storage node electrode which contacts the source region is formed within the interlayered insulating layer.

Herein, the step of forming the impurity region includes substeps of forming a mask pattern for exposing the source region on the surface of the semiconductor substrate having the well region; ion-implanting an impurity in an exposed region; and removing the mask pattern.

A method of fabricating a DRAM device according to another embodiment of this invention, includes steps of forming a well region of a first conductivity type in a semiconductor substrate and then a field oxide layer is formed at a selected portion of the semiconductor substrate having the well region. Next, a gate electrode is formed at a selected portion of a top surface of the semiconductor substrate between the field oxide layers, and source and drain regions of a second conductivity type are then formed at both sides of the gate electrodes within the well region. Successively, an interlayered insulating layer is formed all over the surface of the semiconductor substrate having the gate electrode, the source and drain regions. The interlayered insulating layer is etched such that the source region is exposed, to form a contact hole for a storage node. Afterwards, an impurity ion of a second type is plug-ion implanted at the source region. Following the plug ion implantation, an impurity is ion-implanted to the surface of the resultant structure having the contact hole for the storage node to form an impurity region at a junction interface between the source region and the well region. Next, a storage node electrode is formed over the surface of the resultant structure having the impurity region.

In the first embodiment and the second embodiment of this invention, when the first conductivity type is P type, an impurity to form an impurity region is N type and the N type impurity is, for example, phosphorus. At this time, an implantation dose of phosphorus is $1\times10^{12}$ to $7\times10^{12}$ ions/$cm^2$ and an implantation energy thereof is about 50 to 300 KeV.

Alternatively, when the first conductivity type is N type, the ion to form an impurity region is P type and the P type impurity is, for example, boron. At this time, an implantation dose of boron $1\times10^{11}$ to $7\times10^{11}$ ions/$cm^2$ and ion implantation energy thereof is about 30 to 100 KeV.

In the case that the impurity is of the second conductivity, phosphorus is used. Ion implantation energy of phosphorus is about 50 to 300 KeV with dosage of $1\times10^{11}$. Moreover, at the step of plug ion implantation, an impurity having the same conductivity type with the source region is used.

BRIEF DESCRIPTION OF THE DRAWINGS

FIG. 1b is a graph showing a distribution of an impurity concentration according to a depth of an junction region of the prior art DRAM device.

DESCRIPTION OF THE PREFERRED EMBODIMENTS

Figure 1A:
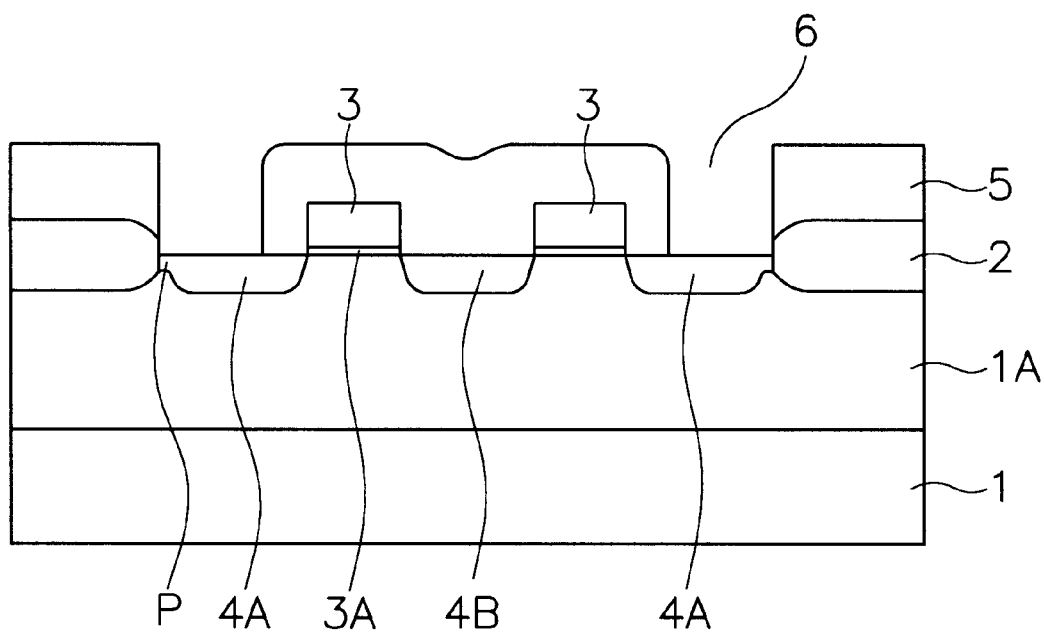
FIG. 1a is a cross-sectional view of the DRAM device according to the prior art.

Referring now to the drawings, the embodiments of this invention will be described in detail.

So as to reduce a leakage current generated since a strong electrical field occurs at the source region due to a damage of the source region which a storage node electrode contacts, this invention is directed to a technology of reducing an electrical field generated at the source region by using a counter doping.

Embodiment 1

Figure 2A:
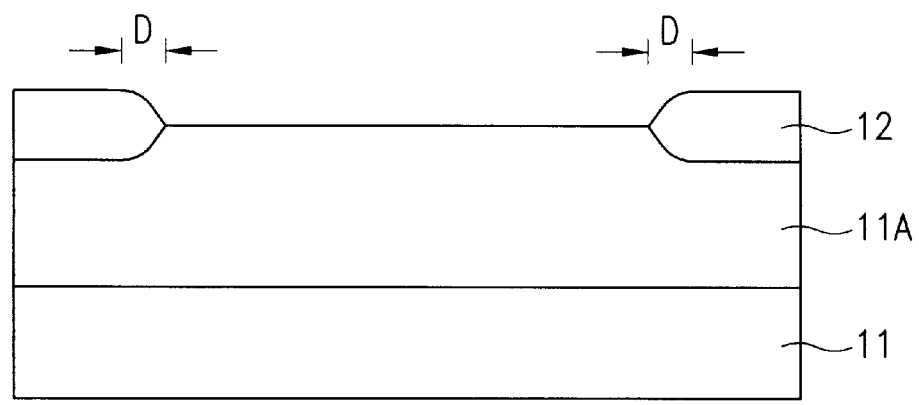
FIGS. 2a, 2b, and 2c are cross-sectional views for describing the steps of fabricating the DRAM device according to one embodiment of this invention.

Referring to FIG. 2a, an impurity of a first conductivity type, for example, an impurity of P type is ion-implanted an implantation dose of about $1.0\sim1.5\times10^{17}$ ions/$cm^2$ in a semiconductor substrate 11; and the semiconductor substrate 11 is then heat-treated to form a well region of P type 11A. A field oxide layer 12 is formed at a selected portion of the semiconductor substrate 11 having the well region of P type 11A in a LOCOS technology. At both end portions of the field oxide layer 12 is occurred a bird's beak D.

Figure 2B:
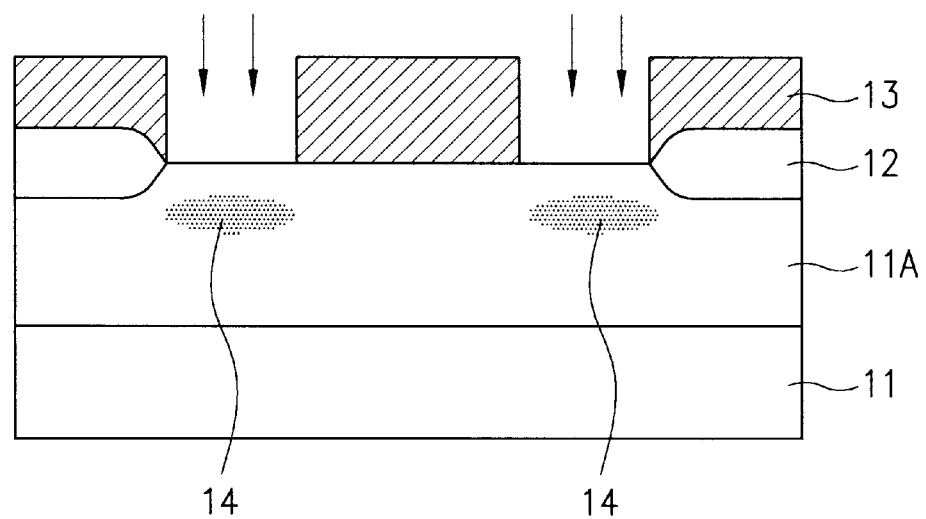

Referring to FIG. 2b, a selected mask pattern 13 is formed all over the surface of the resultant structure except for a portion of the semiconductor substrate 11 which a storage node electrode is to contact. So as to increase the width of the depletion region at the source region, an impurity ion of second conductivity type, i.e., N type is implanted in exposed the portion of the semiconductor substrate 11 using the mask pattern 13 to form an impurity region 14. Here, as for the N type impurity ion, phosphorus is used, the implantation dose thereof is about $1\times10^{12}$ to $7\times10^{12}$ ions/$cm^2$, and an implantation energy thereof within the approximate range of 50 to 300 KeV is used.

Alternatively, if an impurity is formed in the N type well, the impurity ion to increase the width of the depletion region is boron, the implantation dose thereof is about $1\times10^{11}$ to $7\times10^{11}$ ions/$cm^2$, and an implantation energy thereof within the approximate range of 10 to 100 KeV is used.

Here, the implantation dose and the implantation energy are controlled such that the impurity region 14 is located at an interface between the source region and the well region of P type (i.e., an area underlying the source region).

Figure 2C:
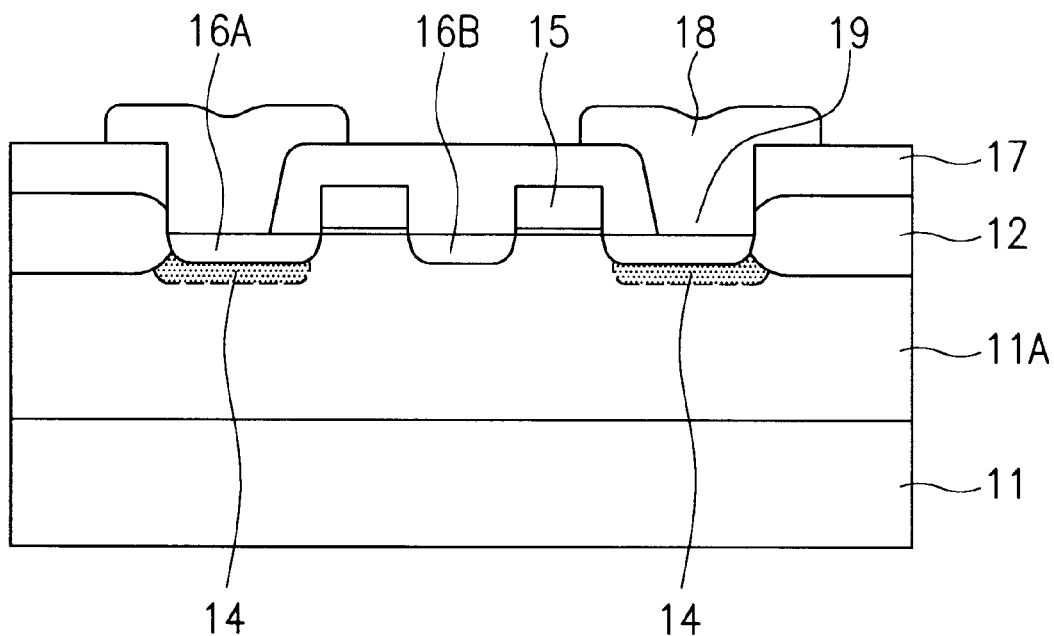

Next, the mask pattern 13 is removed by a plasma ashing and as shown in FIG. 2c, in a known technology a gate electrode 15, source and drain regions 16A and 16B, and an interlayered insulating layer 18 are sequentially formed on a top surface of the semiconductor substrate. The source region 16A is a region which a storage node electrode is to contact and the source region 16A is formed such that it contacts an underlying impurity region 14. Afterwards, so as to expose a portion of the source region 16A, an interlayered insulating layer 17 is etched to form a contact hole 19. At the time the contact hole 19 is formed to have a sufficient margin by etching a bird's beak generated inevitably at the time of forming the field oxide layer. However, the source region is damaged due to the etching of the bird's beak. Accordingly, so as to compensate for such damage a plug ion, for example phosphorus ion which is of a same conductivity type as that of the source region is implanted in the source region.

Following plug ion implantation, a polysilicon layer doped with impurities including phosphorus ion is formed all over the surface of the substrate having the interlayered layer 17 and is then patterned to form a storage node electrode 18 which contacts the source region 14.

As described, when an impurity region 14 of different conductivity type from the P well 11A is formed at a lower portion of the source region 16A, the width of the depletion region formed at a junction interface of the source region 16A and the P well 11A is increased thereby decreasing the electric field applied at the source region. Therefore, the junction leakage current due to the strong electric field in the source region is reduced and the refresh characteristic of DRAM device is improved.

Embodiment 2

FIGS. 3a, 3b, 3c and 3d show another embodiment of this invention. This embodiment is different from the embodiment 1 in that an impurity ion implantation step for increasing a width of a depletion region is carried out after the formation of the source and drain regions.

Figure 3A:
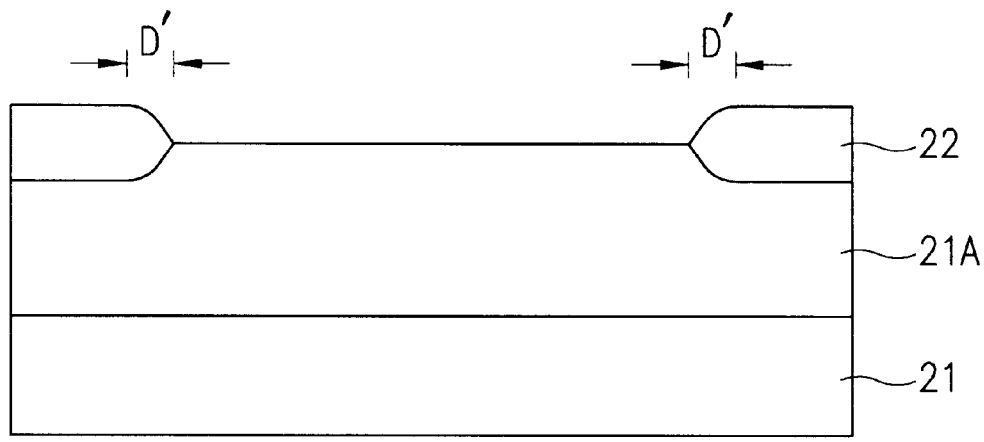
FIGS. 3a, 3b, 3c and 3d are cross-sectional views for describing the steps of fabricating the DRAM device according to another embodiment of this invention.

Referring to FIG. 3a, an impurity of a first conductivity type, i.e., an impurity of P type is implanted an implantation dose of about $1.0\sim1.5\times10^{17}$ ions/$cm^2$ in a semiconductor substrate 21 and the semiconductor substrate 21 is then heat-treated to form a P type well region 21A. A field oxide layer 22 is formed at a selected portion of the semiconductor substrate 21 having a P type well region 21A in a known LOCOS technology. At this time, a bird's beak D' is formed at both ends of the field oxide layer 22.

Figure 3B:
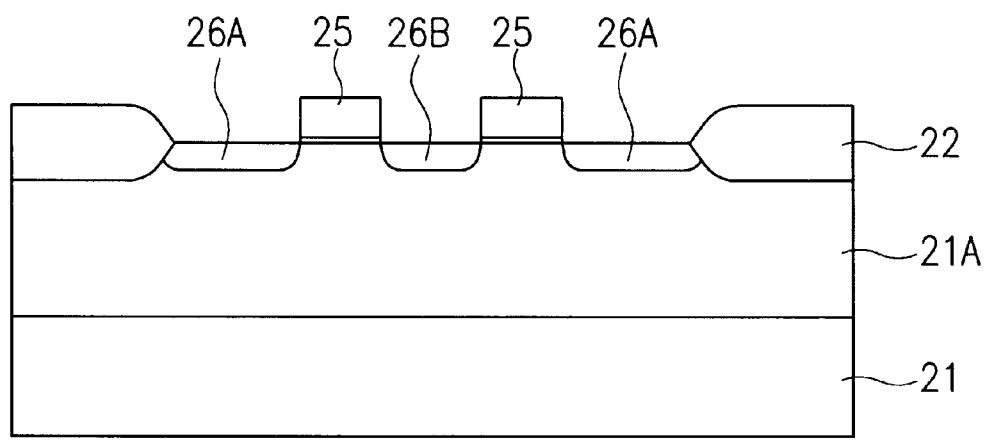
Figure 3C:
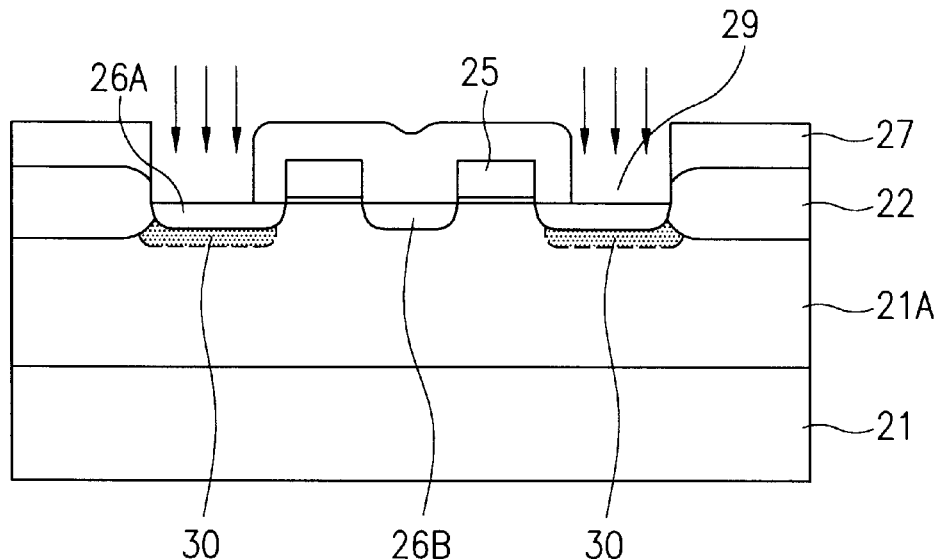

Referring to FIGS. 3b and 3c, a gate electrode 25 is formed on a top surface of a semiconductor substrate 21 defined by the field oxide layer 22, source region 26A and drain region 26B are formed in the substrate, and an interlayered insulating layer 27 with a contact hole 29 is formed over the substrate. The source region 26A is electrically connected with a storage node electrode to be formed, through the contact hole 29. So as to obtain a sufficient margin for the contact hole, the bird's beak (D') of the field oxide layer 22 is etched. However, even the source region 26A, i.e., the junction region is damaged due to the etching of the bird's beak. Accordingly, so as to compensate for the etching damage, phosphorus ion which is of the same conductivity as that of the source region 26A is plug ion implanted on the source region 26A. Next, so as to increase a depletion region at the source region 26A, an ion implantation is carried out to form a selected impurity region 30 at an interface between the source region 26A and the P type well region 21A. An impurity used in the step of ion implantation for increasing the depletion region is a second conductivity type impurity ion, for example phosphorous ion. The implantation dose thereof is about $1 \times 10^{12}$ to $7 \times 10^{12}$ ions/cm$^2$, and an implantation energy thereof within the approximate range of 50 to 300 KeV is used. Alternatively, if an impurity is formed in the N type well, the impurity ion to increase the width of the depletion region is boron, the implantation dose thereof is about $1 \times 10^{11}$ to $7 \times 10^{11}$ ions/cm$^2$, and an implantation energy thereof within the approximate range of 10 to 100 KeV is used.

Figure 3D:
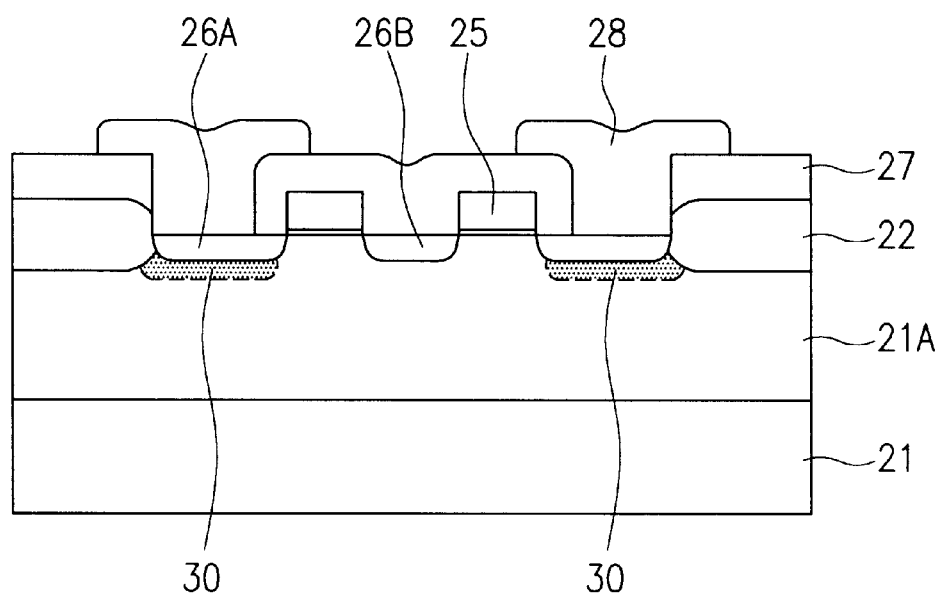

Referring to FIG. 3d, a polysilicon is deposited all over the surface of the resultant structure and is patterned to form a storage node electrode which contacts the source region 26A.

Figure 4:
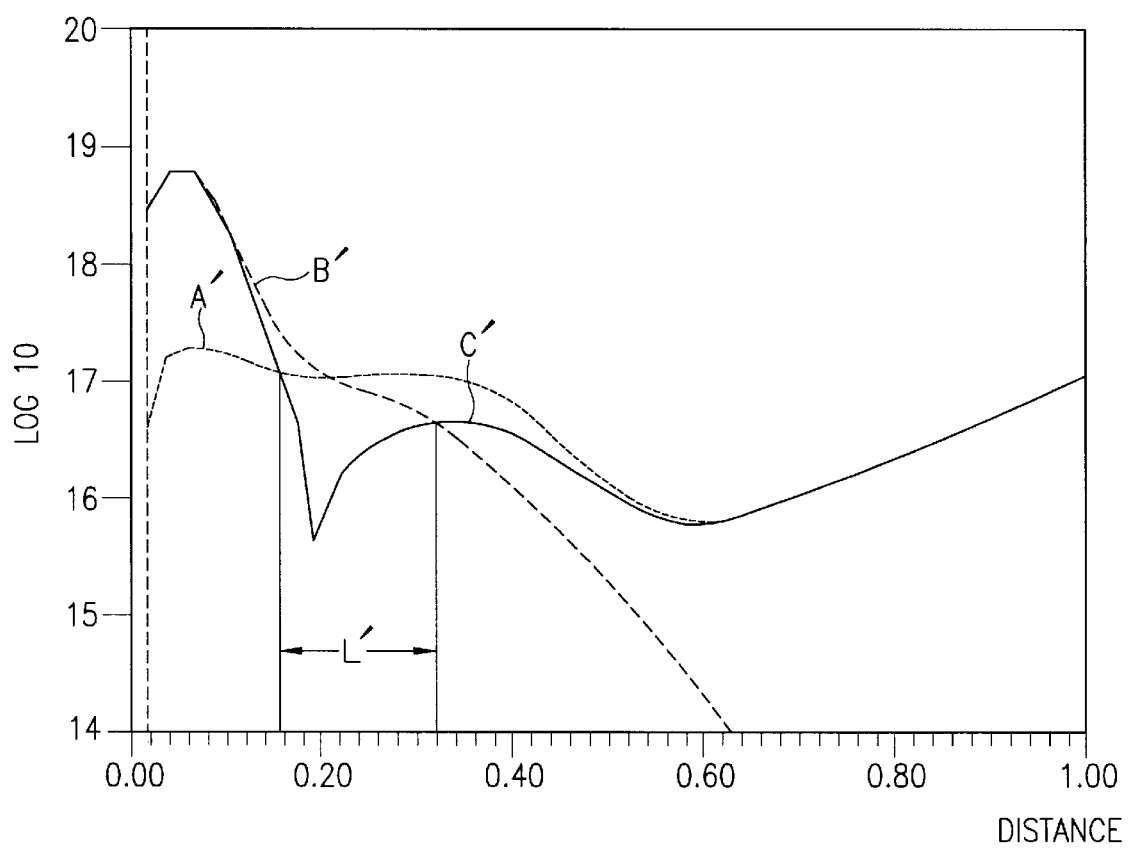
FIG. 4 is a graph showing a distribution of an impurity concentration according to a depth of the junction area of the DRAM device according to this invention.

FIG. 4 which corresponds to FIG. 1b, is a graph showing a concentration distribution of an impurity ion according to a depth of the source region of the DRAM device formed in the embodiments of this invention. Here, a curve A' shows a doping profile of P type (a first conductivity type) well region according to a depth of the semiconductor substrate, a curve B' shows a doping profile of the source region doped with a second conductivity type impurity ion according to a depth of the semiconductor substrate. A curve C' shows a difference of concentration distribution between the curve A' and the curve B'.

The curve A' shows that an impurity concentration is almost uniformly distributed until a selected depth of a semiconductor substrate. However, the curve B' showing the profile of the source region depicts that an impurity ion concentration has a peak value at a surface of the semiconductor substrate and then from the peak value an impurity ion concentration gradually decreases. The curve C' shows that it rapidly decreases at an intersecting portion of the curve A' and the curve B'. The curve C' approaches the curve A' after that, i.e., has an almost same impurity concentration as the P well region. At this time, since impurity regions 14 and 30 are formed at a portion of rapidly decreasing from the curve C', i.e., at a junction interface between the source region and the P well region width, a depletion region L' is larger than the depletion region width of FIG. 2. Therefore, an electrical field at the source regions 16A and 26A is reduced, thereby to decrease the junction leakage.

As described, an impurity of different conductivity type from the well region is implanted at an interface of the source region and the well thereby increasing the width of the depletion region. Impact ionization at the region can be prevented by reducing the strong electric field at a source region to which a storage node electrode is connected. Therefore, the junction leakage is reduced and the refresh characteristic of DRAM device is improved.

While the invention has been described in terms of the preferred embodiments, those skilled in the art will recognize that the invention can be practiced with modification within the spirit and scope of the appended claims.

What is claimed is:

1. A method of fabricating a DRAM device comprising the steps of:

forming a well region of a first conductivity type in a semiconductor substrate;

forming a mask pattern which exposes a portion of the semiconductor substrate having the well region;

ion implanting an impurity of the second conductivity type in an exposed region to form an impurity region in the semiconductor substrate;

removing the mask pattern;

forming a gate electrode on a selected portion of a top surface of the semiconductor substrate having the well region formed therein;

forming source region and drain region both of a second conductivity type at both sides of the gate electrode within the well region, the source region formed between the impurity region and the surface of the semiconductor substrate;

forming an interlayered insulating layer all over the surface of the semiconductor substrate having the gate electrode, the source region and the drain region;

etching a selected portion of the interlayered insulating layer such that the source region is exposed, to form a contact hole for a storage node;

plug ion implanting an impurity of a second conductivity type in the source region; and forming a storage node electrode which contacts the source region on a top surface of the interlayered insulating layer.

2. The method of fabricating the DRAM device of claim 1, wherein the first conductivity type is P type and the second conductivity type is N type.

3. The method of fabricating the DRAM device of claim 2, wherein the step of forming the impurity region includes steps of forming a mask pattern which exposes the source region on the semiconductor substrate having the well region; ion implanting an impurity in the exposed region; and removing the mask pattern.

4. The method of fabricating the DRAM device of claim 3, wherein the impurity is the second conductivity type.

5. The method of fabricating the DRAM device of claim 1, wherein the impurity is phosphorus, an implantation dose thereof is about $1 \times 10^{12}$ to $7 \times 10^{12}$ ions/cm$^2$, and an implantation energy thereof is within a range of 50 to 300 KeV.

6. A method of fabricating a DRAM device comprising the steps of:

forming a well region of a first conductivity type in a semiconductor substrate;

forming a field oxide layer at a selected portion of the semiconductor substrate having the well region;

forming a gate electrode at a selected portion of a top surface of the semiconductor substrate between the field oxide layers;

forming source region and drain region both of a second conductivity type at both sides of the gate electrode within the well region;

forming an interlayered insulating layer all over the surface of the semiconductor substrate having the gate electrode, the source region and the drain region;

etching a selected portion of the interlayered insulating layer such that the source region is exposed, to form a contact hole for a storage node;

plug ion implanting an impurity of a second conductivity in the source region;

implanting an impurity ion of the second conductivity type all over the surface of the resultant structure having the contact hole for the storage node, to form an impurity region at a junction interface between the source region and the well region; and forming a storage node electrode which contacts the source region on a top surface of the interlayered insulating layer.

7. The method of fabricating the DRAM device of claim 6, wherein the first conductivity type is P type and the second conductivity type is N type.

8. The method of fabricating the DRAM device of claim 7, wherein at the step of forming the impurity region the impurity is the second conductivity type.

9. The method of fabricating the DRAM device of claim 6, wherein the impurity is phosphorus, an implantation dose thereof is about $1 \times 10^{12}$ to $7 \times 10^{12}$ ions/cm$^2$, and an implantation energy thereof is within a range of 50 to 300 KeV.

10. The method of fabricating the DRAM device of claim 1, wherein the first conductivity type is N type and the second conductivity type is P type.

11. The method of fabricating the DRAM device of claim 10, wherein the step of forming the impurity region includes steps of forming a mask pattern which exposes the source region on the semiconductor substrate having the well region; ion implanting an impurity in the exposed region; and removing the mask pattern.

12. The method of fabricating the DRAM device of claim 6, wherein the first conductivity type is N type and the second conductivity type is P type.

13. The method of fabricating the DRAM device of claim 11, wherein the impurity is the second conductivity type.

14. The method of fabricating the DRAM device of claim 12, wherein the impurity is boron, an implantation dose thereof is about $1 \times 10^{11}$ to $7 \times 10^{11}$ ions/cm$^2$, and an implantation energy thereof is within a range of 30 to 100 KeV.

15. The method of fabricating the DRAM device of claim 12, wherein at the step of forming the impurity region the impurity is the first conductivity type.

16. The method of fabricating the DRAM device of claim 10, wherein the impurity is boron, an implantation dose thereof is about $1 \times 10^{11}$ to $7 \times 10^{11}$ ions/cm$^2$, and an implantation energy thereof is within a range of 30 to 100 KeV.

* * * * *

UNITED STATES PATENT AND TRADEMARK OFFICE
CERTIFICATE OF CORRECTION

PATENT NO.    : 6,087,215
DATED         : July 11, 2000
INVENTOR(S)   : Kim et al.

It is certified that error appears in the above-identified patent and that said Letters Patent is hereby corrected as shown below:

Title page,
Item [56], References Cited, U.S. PATENT DOCUMENTS, after the cited "*Gilgen et al.*" reference, please insert -- 5,376,566  12/1994  *Gonzalez* --.
After the cited "*Hshieh et al.*" reference, please insert -- 5,650,349  7/1997  *Prall et al.* --.
Item [57], ABSTRACT, please delete the existing paragraph and substitute the following therefor -- According to this invention, an impurity region of different conductivity type from a well is formed at a junction interface between the well region and a source region. Therefore, the width of the depletion region formed at the junction interface between the source region and the well increases thereby decreasing junction leakage current and improving a refresh characteristic of DRAM device. --

Column 1,
Line 43, please delete "the" and substitute -- for -- therefor.
Line 44, please delete "occurred" and substitute -- occurring -- therefor.

Column 2,
Line 5, please delete "has" and substitute -- it is -- therefor.
Line 47, please delete "implanted" and substitute -- implantation -- therefor.

Column 3,
Line 3, after "second" please insert -- conductivity --.
Lines 23-25, please delete "In the case that the impurity is of the second conductivity, phosphorus is used. Ion implantation energy of phosphorus is about 50 to 300 KeV with dosage of $1 \times 10^{11}$."
Line 34, please delete "an" and substitute -- a -- therefor.
Line 61, please delete "1.0" and substitute -- $1.0 \times 10^{17}$ -- therefor.
Line 67, please delete "occurred" and substitute -- formed -- therefor.

Column 4,
Line 4, please delete "the".
Line 26, after "substrate" please insert -- 11 --.
Line 32, after "time" please insert -- , --.
Line 36, after "damage" please insert -- , --.
Line 63, please delete "1.0" and substitute -- $1.0 \times 10^{17}$ -- therefor.

UNITED STATES PATENT AND TRADEMARK OFFICE
CERTIFICATE OF CORRECTION

PATENT NO. : 6,087,215
DATED : July 11, 2000
INVENTOR(S) : Kim et al.

It is certified that error appears in the above-identified patent and that said Letters Patent is hereby corrected as shown below:

Column 5,
Line 11, please delete "(D')" and substitute -- D' -- therefor.
Line 16, after "conductivity" please insert -- type --.
Line 61, please delete "width".
Line 61, after "L'" please insert -- width --.
Line 62, after "width" please insert -- L --.

Signed and Sealed this

Twenty-fourth Day of June, 2003

JAMES E. ROGAN
*Director of the United States Patent and Trademark Office*